United States Patent
Abercrombie et al.

(10) Patent No.: US 7,013,468 B2
(45) Date of Patent: Mar. 14, 2006

(54) METHOD AND APPARATUS FOR DESIGN AND MANUFACTURING APPLICATION ASSOCIATIVE INTEROPERABILITY

(75) Inventors: Phil J. Abercrombie, Belmont, MA (US); Blake Z. Courter, Boston, MA (US)

(73) Assignee: Parametric Technology Corporation, Needham, MA (US)

( * ) Notice: Subject to any disclaimer, the term of this patent is extended or adjusted under 35 U.S.C. 154(b) by 757 days.

(21) Appl. No.: 10/085,842

(22) Filed: Feb. 26, 2002

(65) Prior Publication Data

US 2003/0163605 A1 Aug. 28, 2003

(51) Int. Cl.
*G06F 9/46* (2006.01)
(52) U.S. Cl. .................. 719/328; 719/310; 703/182
(58) Field of Classification Search ............. 719/310, 719/328; 703/182; 710/95–98; 700/180–182; 706/919
See application file for complete search history.

(56) References Cited

U.S. PATENT DOCUMENTS

| | | | | |
|---|---|---|---|---|
| 5,226,161 A | * | 7/1993 | Khoyi et al. | 719/316 |
| 5,828,575 A | * | 10/1998 | Sakai | 700/182 |
| 5,872,971 A | * | 2/1999 | Knapman et al. | 718/101 |
| 6,201,996 B1 | * | 3/2001 | Crater et al. | 700/9 |
| 6,356,957 B1 | * | 3/2002 | Sanchez et al. | 719/328 |
| 6,438,745 B1 | * | 8/2002 | Kanamaru et al. | 717/137 |
| 6,542,937 B1 | * | 4/2003 | Kask et al. | 719/328 |
| 6,614,430 B1 | * | 9/2003 | Rappoport | 345/420 |
| 6,738,060 B1 | * | 5/2004 | Ujiie et al. | 345/420 |
| 6,826,756 B1 | * | 11/2004 | Herrod et al. | 719/310 |
| 6,847,384 B1 | * | 1/2005 | Sabadell et al. | 345/672 |

\* cited by examiner

*Primary Examiner*—Meng-Al T. An
*Assistant Examiner*—G. Lawrence Opie
(74) *Attorney, Agent, or Firm*—Lahive & Cockfield, LLP

(57) ABSTRACT

A method and apparatus relating to a CAD system that enables communication between a first CAD application and a second CAD application in a manner providing associative interoperability is provided. In one illustrative example, a method is provided in at least one electronic device of communicating between a first CAD application and a second CAD application. The method begins by storing native data and a sub-set of native data. A plug-in is provided having an application program interface API and being accessible by the second CAD application. The plug-in conveys the sub-set of native data to the second CAD application. The system for carrying out the method includes a first CAD application and a second CAD application. Native data and a sub-set of native data relating to an object modeled on the first CAD application are stored in a first memory store. A plug-in is accessible by the second CAD application and is suitable for accessing and retrieving the subset of native data to enable the second CAD application to create a second model of at least a portion of the object modeled on the first CAD application. The first CAD application does not need to export a file containing the object.

36 Claims, 7 Drawing Sheets

METHOD AND APPARATUS FOR DESIGN AND MANUFACTURING APPLICATION ASSOCIATIVE INTEROPERABILITY

RELATED APPLICATION

This application is being filed with counterpart application U.S. application Ser. No. 10/085,844, filed Feb. 26, 2002, which is hereby expressly and entirely incorporated herein by reference.

FIELD OF THE INVENTION

The present invention relates to computer aided design applications, and more particularly to the provision of a library enabling computer aided design applications to become associatively interoperable by providing access to native data files.

BACKGROUND OF THE INVENTION

A computer-aided design ("CAD") system is a computer implemented tool for engineers and architects to utilize in designing a plethora of structures from products to buildings. The computer portion of the CAD system includes a central processing unit, a display device, such as a computer monitor, and a number of input devices such as, a keyboard, a mouse, a light pen, a digitialising tablet, and the like. The central processing unit has one or more CAD software applications installed thereon.

The CAD software applications allow a user to input and view a design for a particular structure in the form of an object. The user can often rotate the view of the object to any angle, and also zoom in or zoom out for different views and perspectives. Additional visual features such as highlighting, shading, cross-hatching, and the like, enable the user to design an object with the aid of the computing power inherent in the central processing unit. The CAD application can also keep track of, and monitor, design changes to the object in addition to design dependencies. This means that when the user adds or changes an element within the object, other values that depend on that change are automatically updated in accordance with engineering concepts and rules of design.

CAD systems have been in existence for a number of decades. As a result, different CAD systems have been developed utilizing different computer hardware platforms and different computer software applications. Companies that utilize these CAD systems are often in the situation wherein a decision was made in years past to purchase a particular CAD system, and due the expense of changing to a different CAD system, have maintained and continuously updated the original CAD system as updated versions are released from the CAD system manufacturer. It is difficult to change the particular CAD system that a company utilizes in creating their designs, because most often, different CAD systems are not interoperable. Without interoperability, one cannot take a model of a structure created on a first CAD system and simply transfer that modeled object to a second, different, CAD system, without experiencing compatibility issues.

Some CAD systems include the feature of being able to export data relating to a model of an object to another CAD system. However, this requires a user of the first CAD system to proactively select a particular model of an object, and perform a series of functions to modify the data relating to that object and export it to a remote CAD system, or a remote file location. A user of the second CAD system then must read the exported file and translate the data into a compatible format for the second CAD system. This makes it difficult for engineers designing different pieces of a larger structure to utilize different CAD systems on an individual basis. Collaboration between engineers in remote locations using different CAD systems becomes logistically complicated to orchestrate. In addition, it is often the case that an object that is exported to a different CAD system becomes stripped of the complete history of how it was constructed. Therefore, a user of the second CAD system cannot look back into history of steps that were utilized to form the particular object. This can hinder the development of the object and the overall design because an engineer often requires knowledge of such histories. It also can lead to design flaws, because a change made in a later version of an object in a different CAD program, likely will not be properly translated back to the originating CAD program. Therefore, the overall design cannot reliably be checked for validity of engineering concepts and rules of design.

The ability to share design data as an object is being created is an important feature. There is often a desire to have the ability to share CAD data and move such data from one application to another application without loss of histories or other data. In addition, this ability to share data is often undesirably hindered by the requirement that a user at the originating CAD system perform several tasks to prepare the data and export it to the second CAD system, which requires communication between users of different CAD systems to share this information.

SUMMARY OF THE INVENTION

There is a need for a method and apparatus relating to a CAD system that enables communication between a first CAD application and a second CAD application in a manner providing associative interoperability. The present invention is directed toward further solutions to address this need.

In accordance with one embodiment, a method is provided in at least one electronic device of communicating between a first CAD application and a second CAD application. The method begins by storing native data and a sub-set of native data. A plug-in is provided having an application program interface ("API") and being accessible by the second CAD application. The plug-in conveys the sub-set of native data to the second CAD application.

A plug-in, as utilized herein, is a hardware or software module that adds a specific feature or service to a larger system. A single module can contain one or more executable routines. Plug-ins can be used dynamically by an application. Instances of plug-ins include DLLs, virtual machine bytecode, scripts, web services, and the like.

In accordance with example embodiments of the present invention, storing comprises placing the native data and the sub-set of native data on a storage medium. The native data can comprise data forming a model of an object in the first CAD application. The sub-set of native data can result from processing the native data with at least one routine from a first library of executable routines to derive the sub-set of native data. The first library of executable routines can be embedded within the first CAD program. The first library of executable routines can alternatively exist in a component accessible by the first CAD program. The plug-in can comprise a second library of executable routines. In accordance with further aspects of the present invention, a step of conveying can further comprise the second CAD application calling a second library of executable routines to utilize an API to request the native data and the sub-set of native data.

In accordance with another aspect of the present invention a first library of executable routines can be provided. In addition, the native data can be generated as an object is modeled in the first CAD application. The sub-set of native data can be created utilizing a first library of executable routines.

In accordance with further aspects of the present invention, a third library of executable routines accessible by the second CAD application can be provided. The third library of executable routines can be embedded within the second CAD application, or can be a component accessible by the second CAD application.

In accordance with still further aspects of the present invention, the first CAD application can notify the second CAD application about updates to the sub-set of native data. The first CAD application can also receive a notification of a modification of the object from the second CAD application.

In accordance with further embodiments of the present invention, the first CAD application and/or the second application can communicate with additional applications such as, e.g., an analysis application and/or a manufacturing application.

In accordance with still another embodiment of the present invention, a method is provided in at least one electronic device of communicating between a first CAD application and a second CAD application. The method includes providing a model of an object on the first CAD application. A plug-in is utilized in the second CAD application to retrieve a sub-set of native data from the first CAD application relating to the model of the object. The sub-set of native data enables the second CAD application to create a second model of at least a portion of the object on the second CAD application.

In accordance with still another embodiment of the present invention, a system is provided for modeling an object. The system includes a first CAD application and a second CAD application. Native data and a sub-set of native data relating to an object modeled on the first CAD application are stored in a first memory store. A plug-in is accessible by the second CAD application and is suitable for accessing and retrieving the sub-set of native data to enable the second CAD application to create a second model of at least a portion of the object modeled on the first CAD application. The first CAD application does not need to export a file containing the object.

In accordance with further aspects of the present invention, the system can include, a first library of executable routines accessible by the first CAD application. The first library of executable routines can be either embedded within the first CAD application, or a component accessible by the first CAD application. The sub-set of native data can result from utilization of at least one executable routine of the first library. The plug-in can include a second library of executable routines and an API. A third library of executable routines can be provided and can be either embedded within the second CAD application, or a component accessible by the second CAD application. The third library of executable routines can be suitable for reading the sub-set of native data utilizing the third library of executable routines to translate the sub-set of native data and create the second model of at least a portion of the object in the second CAD application.

In accordance with still another embodiment of the present invention, a method is provided in at least one electronic device of communicating between a first CAD application and a second CAD application. The method includes providing a first library of executable routines accessible by the first CAD application. Native data is generated as an object is modeled in the first CAD application. A sub-set of native data is created utilizing the first library of executable routines. The native data and the sub-set of native data are stored. A second library of executable routines is provided in the form of a plug-in having an API and being accessible by the second CAD application. The second library of executable routines can be called to utilize the API to retrieve the native data, filter the native data to extract the sub-set of native data, and convey the sub-set of native data to the second CAD application.

In accordance with further aspects of the present invention, the method can further include providing a third library of executable routines accessible by the second CAD application. The sub-set of native data can be read utilizing the third library of executable routines to translate the sub-set of native data and create a model of at least a portion of the object in the second CAD application.

In accordance with yet another embodiment of the present invention, a method is provided in at least one electronic device of communicating between a first application and a second application. The method includes storing native data and a sub-set of native data. A plug-in is provided having an API and being accessible by the second application. The sub-set of native data is conveyed by the plug-in.

BRIEF DESCRIPTION OF THE DRAWINGS

The aforementioned features and advantages, and other features and aspects of the present invention, will become better understood with regard to the following description and accompanying drawings, wherein.

DETAILED DESCRIPTION

Figure 1:
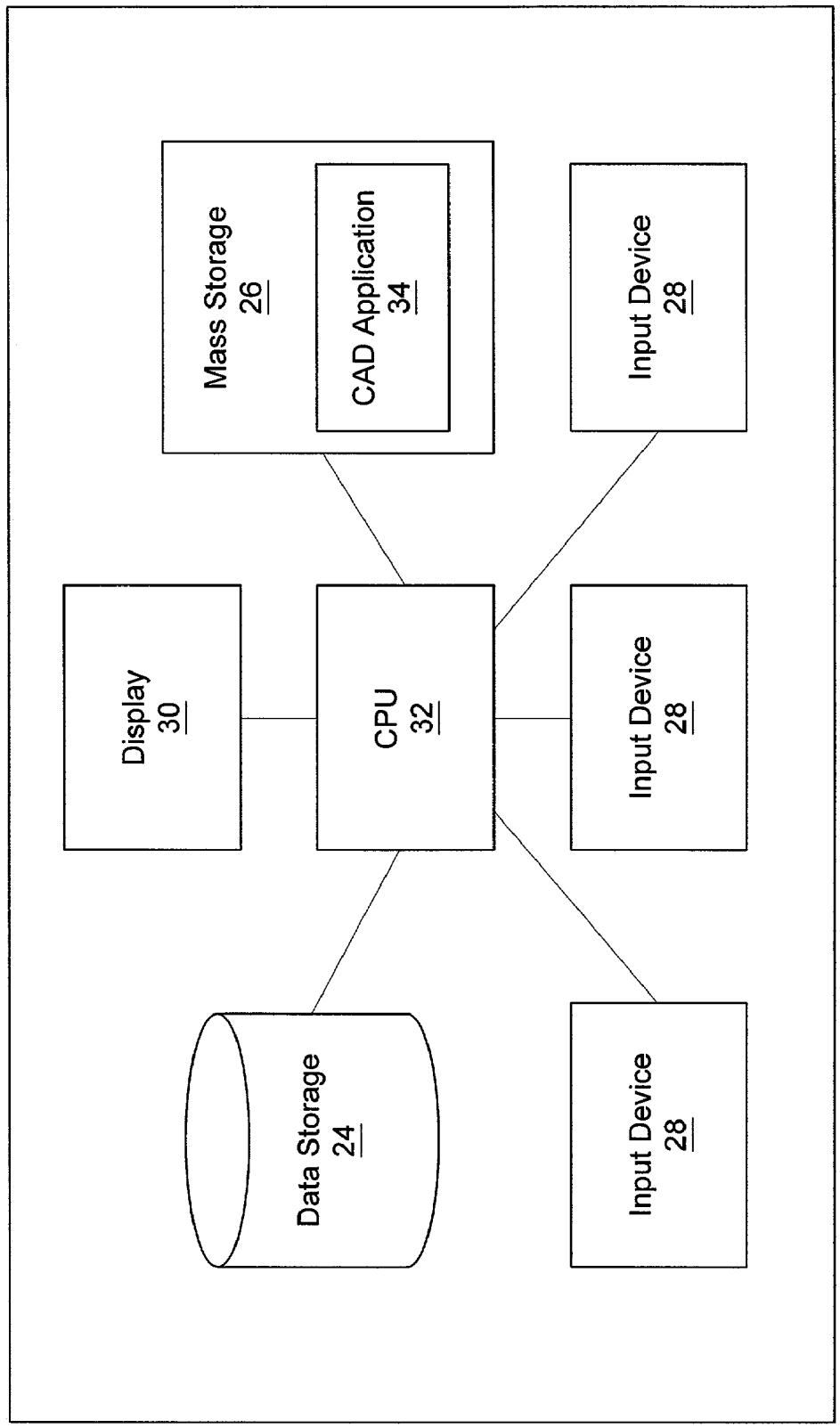
FIG. 1 is a diagramatic illustration of a conventional CAD system.

An illustrative embodiment of the present invention relates to a method and apparatus providing associative interoperability between two or more design or manufacturing related applications. Each of the design or manufacturing related applications can read each other's native data files to evaluate and create model objects. Associativity is realized in that when a modification is made within one of the engineering or manufacturing based applications, the other engineering or manufacturing related applications can receive notifications and obtain updates as to the modifications without a cumbersome exporting process.

FIGS. 2 through 5, wherein like parts are designated by like reference numerals throughout, illustrate example embodiments of a method and apparatus for providing associative interoperability between engineering and manufacturing design applications according to aspects of the present invention. Although the present invention will be described with reference to the example embodiments illustrated in the figures, it should be understood that many alternative forms can embody the present invention. One of ordinary skill in the art will additionally appreciate different ways to alter the parameters of the embodiments disclosed, such as the size, shape, type of elements, or materials, form of data, type of application or the like, in a manner still in keeping with the spirit and scope of the present invention.

FIG. 1 illustrates a conventional computer aided design ("CAD") system 20. The CAD system 20 includes hardware and software components. A computing apparatus 22 forms the hardware portion of the CAD system 20. The computing apparatus 22 is a programmable device that responds to a specific set of instructions in a well defined manner and can execute a set of instructions. The computing apparatus 22 can include a storage device 24, which enables the computing apparatus 22, to store at least temporarily, data, information, and programs (e.g., RAM or ROM). A mass storage device 26 can substantially permanently store data, information, and programs (e.g., a disk drive or tape drive). An input device 28 can be provided through which data and instructions enter the computing apparatus (e.g., a keyboard, mouse, stylus, light pen, or a digitizing tablet). An output device 30 can be provided to display or produce results of computing actions (e.g., display screen, printer, plotter, or infra red, serial, or digital port). A central processing unit (CPU) 32 can include a processor for executing the specific set of instructions.

A CAD application 34 can be installed, or in communication, with the computer apparatus 22 to provide instructions for processing. The CAD application 34 can be used for e.g., engineering, manufacturing, architectural, or other design or manufacturing functions. One of ordinary skill in the art will appreciate that CAD systems in the past have existed in the form of a dedicated hardware device incorporating the CAD functions and unable to perform non-CAD related operations. More recent CAD systems make use of mainframe or personal computer hardware platforms and are embodied in software applications installed thereon.

Figure 2:
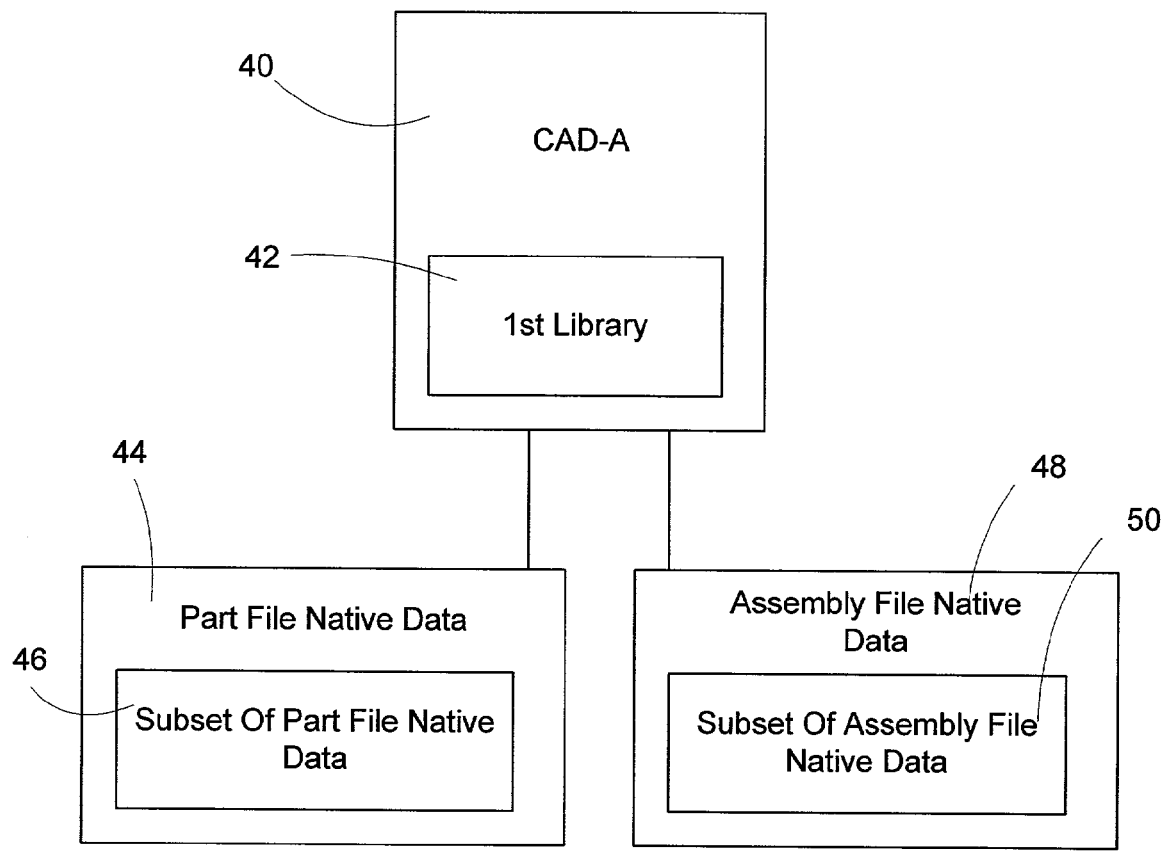
FIG. 2 is a diagrammatic illustration of a CAD application, according to one aspect of the present invention.

FIG. 2 shows a diagrammatic illustration of CAD-A application 34, which is an example embodiment of a CAD application for use in conjunction with the teachings of the present invention. The CAD-A application 34 includes a first library 42 of executable routines. The first library 42 of executable routines enables the manipulation of native data generated by the CAD-A application 34 when an object is modeled. For example, when the CAD-A application 34 models an object, a plurality of files are created. A part-file includes part native data 44 and an assembly file includes assembly native data 48. The part-native data 44 relates to the geometric representation of the part, a set of features that describe how to create the geometric representation of the part, and other information such as annotations, manufacturing information, and dimensional parameters. The assembly native data 48 relates to the location of, and quantities of, parts in an assembly, instructions for placing parts in the proper locations, and different configurations of the assembly.

By native data, what is meant is data in a native file format that is used internally by the CAD-A application 40. When an application stores data, it does so in a native format. One of ordinary skill in the art will appreciate that the illustrated embodiments disclosed herein utilize part native data, assembly native data, sub-sets of part native data, and sub-sets of assembly native data. However, these specific forms of native data are merely examples. Applicants intend the present invention to apply to all forms of native data, and sub-sets thereof, that are accessible and manipulatable in the manner described herein. The invention is not limited to the specific example forms of native data discussed herein. These examples are for illustrative purposes to aid in the explanation of the features of the present invention.

The executable routines of the first library 42 manipulate the part native data 44 to create a sub-set of part native data 46 and/or a sub-set of assembly native data 50. The sub-set of part native data 46 and the sub-set of assembly native data 50 represent data that has been filtered or otherwise extracted from the part native data 44 and the assembly native data 48 of the CAD-A application 40. The sub-set of part native data 46, and the sub-set of assembly native data 50 comprise a predetermined selection of the native data sufficient to enable another CAD application to evaluate, read, recreate, regenerate, or update a model of an object relating to the object modeled in the CAD-A application 34. For example, the sub-set of part native data 46 and the sub-set of assembly native data 50 include information concerning features and attributes of the object modeled in the CAD-A application 34.

A vendor of the CAD-A application 40 provides the CAD-A application 40 with access to the first library 42. This access can be in the form of the first library 42 being embedded in the CAD-A application 40, or the first library 42 can be a component accessible by the CAD-A application 40. In addition, the vendor of the CAD-A application 40 provides a second library in the form of a plug-in 52. The plug-in 52 includes an application program interface ("API") to enable communication between the CAD-A application 40 and another CAD application as described below. The plug-in 52 includes at least one executable routine suitable for accessing the part native data 44 and the assembly native data 48 to extract the sub-set of part native 46 and the sub-set of assembly native data 50.

Figure 3:
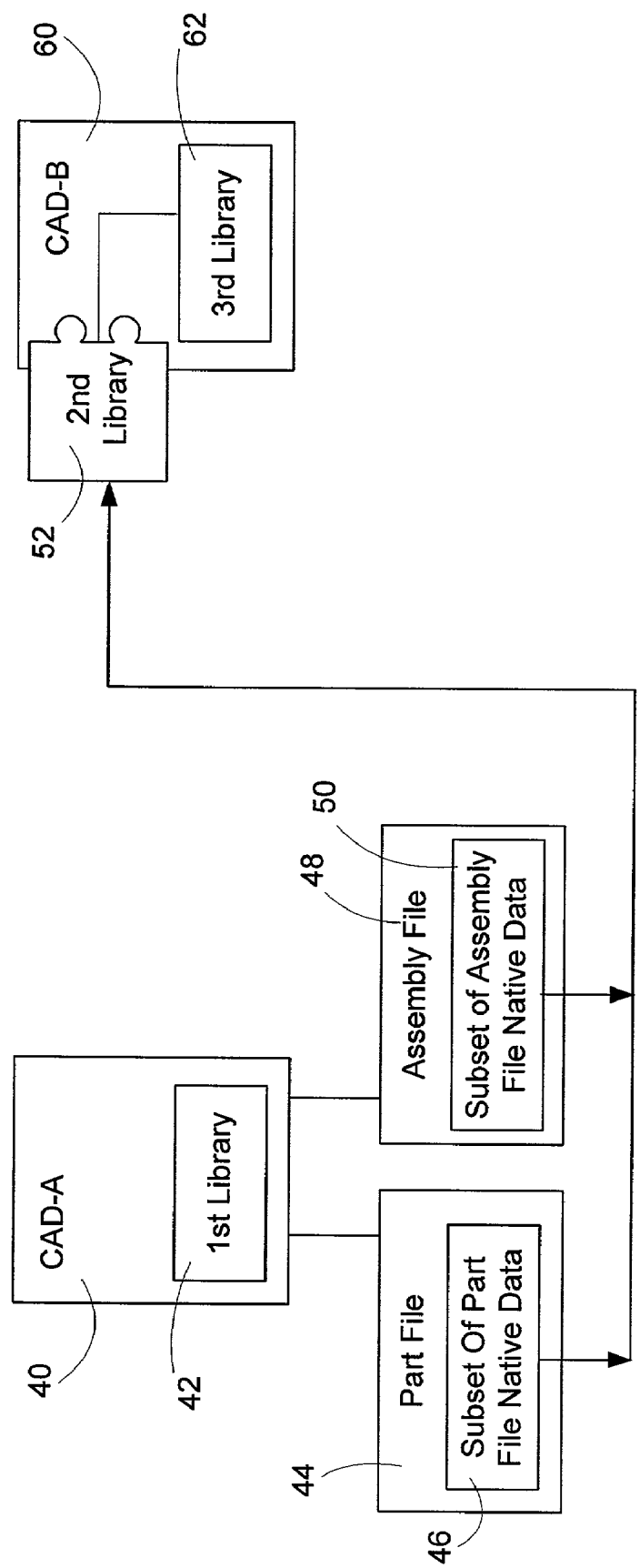
FIG. 3 is a diagrammatic illustration of the CAD application of FIG. 2 interacting with a second CAD application, according to one aspect of the present invention.

FIG. 3 is a diagrammatic illustration of the CAD-A application 40 associatively interoperating with another CAD application, CAD-B application 60. The CAD-B application 60 includes a third library 62 of executable routines. The plug-in 52, provided by the vendor of the CAD-A application 40, is provided to the CAD-B application 60.

In operation, when a model of an object is created on the CAD-A application 40, the part native data 44 and the assembly native data 48 are generated and stored. The sub-set of part native data 46 and the sub-set of assembly native data 50 can be generated by the first library 42 executable routines at the time that the part native data 44 and the assembly native data 48 are generated. Alternatively, the sub-set of part native data 46, and the sub-set of assembly native data 50 can be generated with a filtering process executed by the plug-in 52 when the sub-sets of native data 46 and 50 are requested by the CAD-B application 60. In either instance, if the CAD-B application 60 requires information relating to the object modeled on the CAD-A application 40, the CAD-B application 60 utilizes the plug-in 52 to access the part native data 44 and the assembly native data 48 to retrieve the sub-set of part native data 46 and the sub-set of assembly native data 50.

Once the sub-set of part native data 46 and the sub-set of assembly native data 50 arrive at the CAD-B application 60, the third library 62 of executable routines are utilized by the CAD-B application 60 to recreate, regenerate, or otherwise model at least a portion of the object as originally modeled in the CAD-A operation 40. Because the plug-in 52 can access the native data files of the CAD-A application 40, there is no requirement of the CAD-A application 40, or user thereof, to initiate an exporting process to transfer the data. In other words, the plug-in 52 knows where to find the necessary data in the native files of the CAD-A application 40. Therefore, every time a change is made in the CAD-A application 40, other applications such as the CAD-B applications 60 can read the updated sub-set of part native data 46 information and the sub-set of assembly native data 50 information. The interoperability is achieved by the provision of the plug-in 52 by each vendor making an application such as the CAD-A application 40 for creating models of objects or otherwise manipulating the modeled objects.

Figure 4A:
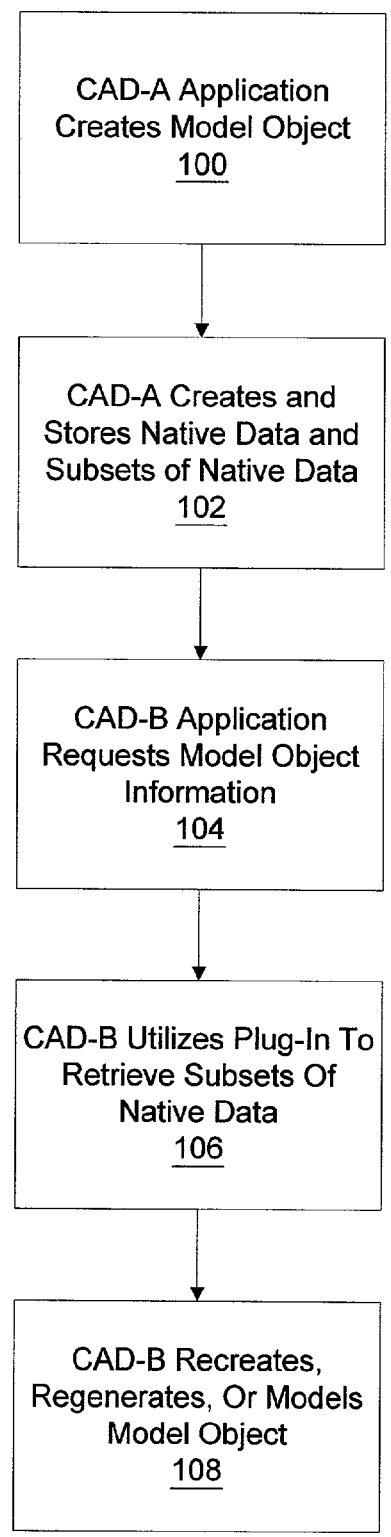
FIGS. 4A and 4B are flowcharts illustrating methods by which native data can be created and transported, according to one aspect of the present invention.
Figure 4B:
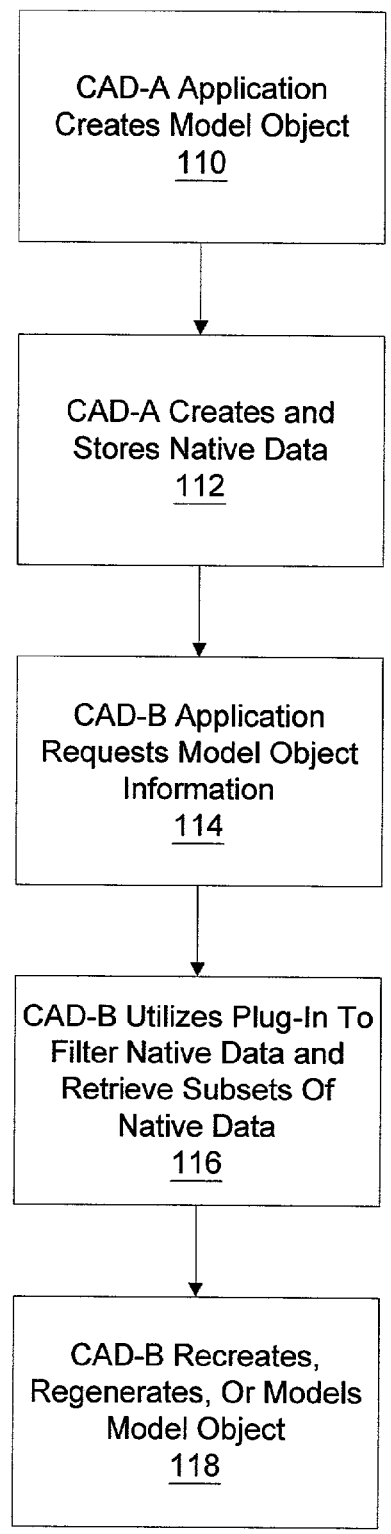

FIGS. 4A and 4B are flowcharts illustrating two possible methods by which the required sub-sets of native data can be created and transported. In FIG. 4A, a model of an object is created on the CAD-A application 40 (step 100). The part native data 44 and the assembly native data 48 are generated and stored, and the sub-set of part native data 46 and the sub-set of assembly native data 50 are generated by the first library 42 of executable routines and stored (step 102). Thus, the part native data 44, the assembly native data 48, the sub-set of part native data 46, and the sub-set of assembly native data 50 all are in existence on one or more storage mediums. The CAD-B application 60 requests information relating to the object modeled on the CAD-A application 40 (step 104). The CAD-B application 60 utilizes the plug-in 52 to access the part native data 44 and the assembly native data 48 to retrieve the sub-set of part native data 46 and the sub-set of assembly native data 50 (step 106). The third library 62 of executable routines are utilized by the CAD-B application 60 to evaluate, read, recreate, regenerate, or otherwise model at least a portion of the object as originally modeled in the CAD-A operation 40 (step 108).

In FIG. 4B, a model of an object is created on the CAD-A application 40 (step 110). The part native data 44 and the assembly native data 48 are generated and stored (step 112). The CAD-B application 60 requests information relating to the object modeled on the CAD-A application 40 (step 114). The sub-set of part native data 46, and the sub-set of assembly native data 50 are generated with a filtering or translation process executed by the plug-in 52 and transferred to the CAD-B application (step 116). The sub-set of part native data 46 and the sub-set of assembly native data 50 in this example are not pre-existing when the CAD-B application 60 requests the information. The third library 62 of executable routines are utilized by the CAD-B application 60 to evaluate, read, recreate, regenerate, or otherwise model at least a portion of the object as originally modeled in the CAD-A operation 40 (step 118).

Figure 4C:
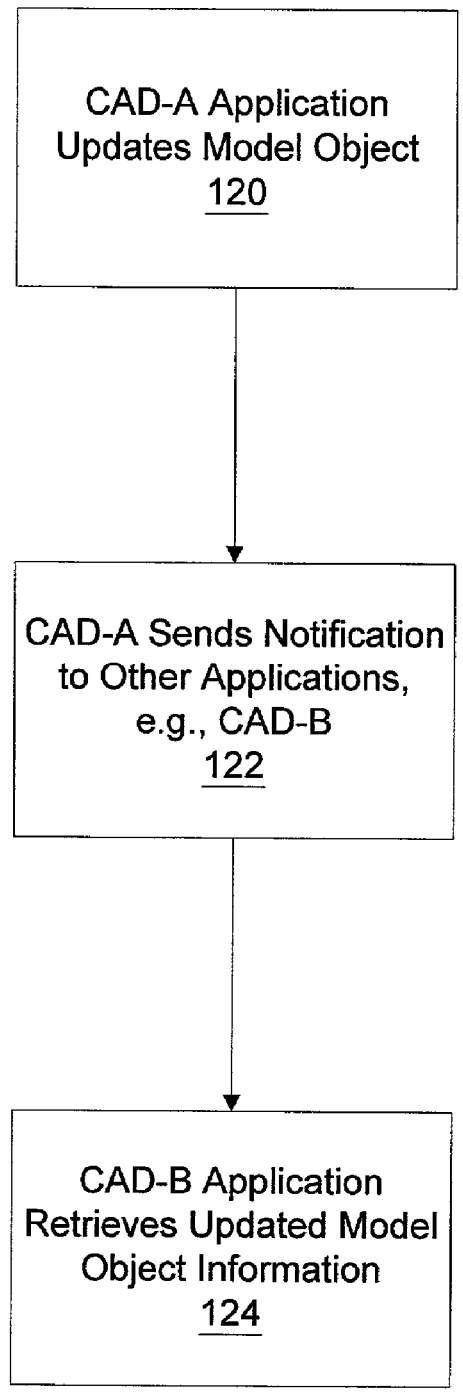
FIG. 4C is a step-wise progression of the update feature, according to one aspect of the present invention.

FIG. 4C shows a step-wise progression of the update feature described previously. An object having been communicated from the CAD-A application 40 to the CAD-B application 60 will often be updated at a point in time subsequent to the transfer of the sub-set of part native data 46 and the sub-set of assembly native data 50. When the CAD-A application 40 updates the object (step 120), the CAD-A application can send a notification to other applications such as the CAD-B application 60 that an update was made (step 122). The CAD-B application 60 can then read the updated sub-set of part native data 46 information and the updated sub-set of assembly native data 50 information (step 124) to ensure that the object on the CAD-B application 60 is consistent with the CAD-A application 40. Likewise, when a change is made to the object in the CAD-B application 60, the CAD-B application can issue notifications to other applications that a change has been made and an update is required.

Figure 5:
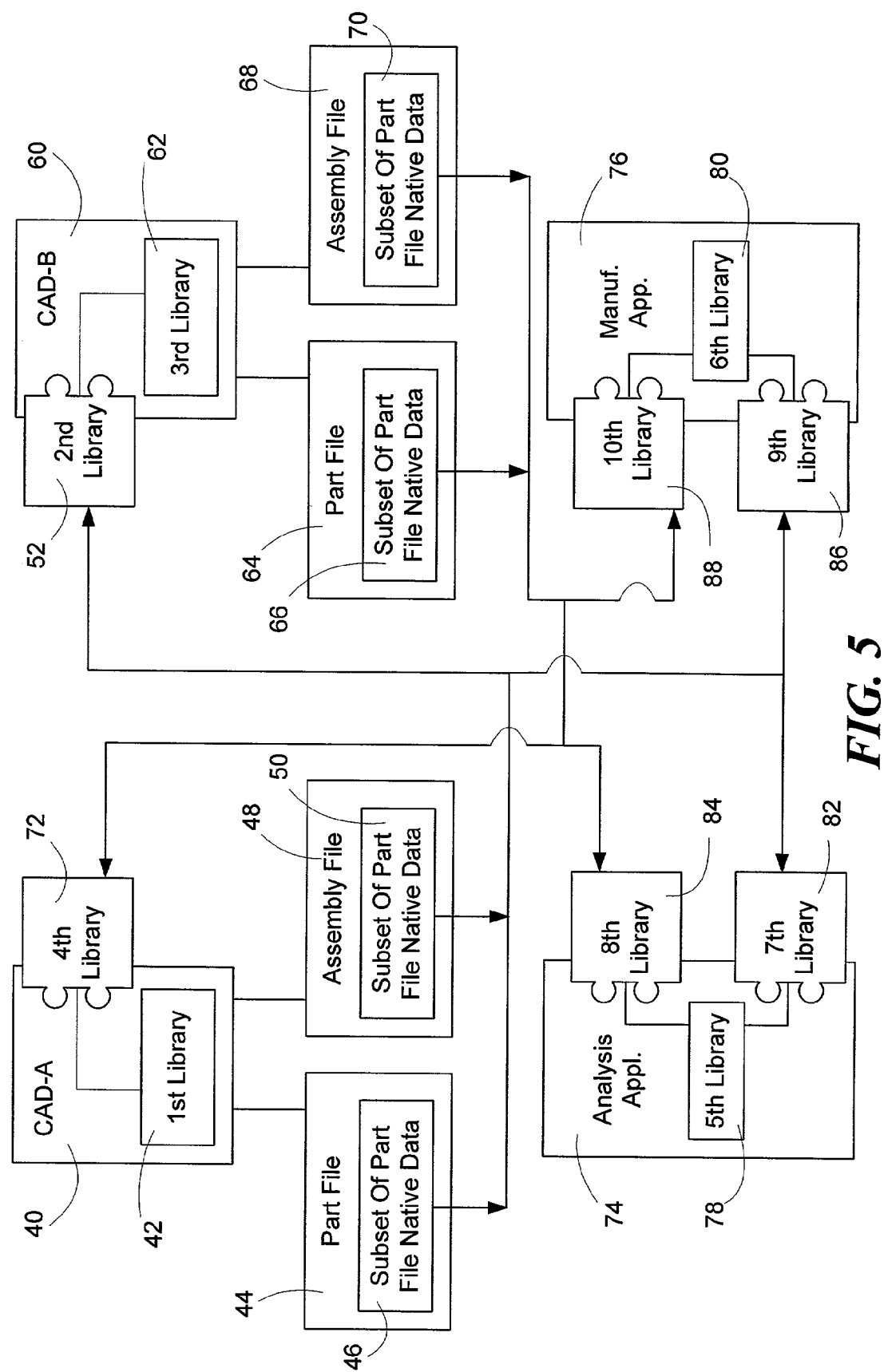
FIG. 5 is a diagrammatic illustration of the CAD applications of FIG. 2 and FIG. 3 interacting with each other and additional applications according to one aspect of the present invention.

FIG. 5 is a diagrammatic illustration further showing the associative interoperability of different applications utilizing the teachings of the present invention. The CAD-A application 40 is provided including the first library 42. The CAD-A application 40, in this embodiment, models the object and creates the part native data 44 and the assembly native data 48. The CAD-B application 60 makes use of the plug-in 52 provided by the vendor of the CAD-A application 40 to access the native data of the CAD-A application 40 and retrieve the sub-set of part native data 46 and the sub-set of assembly native data 50.

The CAD-B application 60 recreates the modeled object originating with the CAD-A application and creates a part file holding part native data 64 and an assembly file holding assembly native data 68. The vendor of the CAD-B application further provides a plug-in 72 containing a fourth library.

The CAD-B application 60, and a user thereof, is then free to make modifications and updates to the modeled object. The modifications and updates can be accessed by the CAD-A application 40 utilizing the plug-in 72 provided by the vendor of the CAD-B application 60. The plug-in 72 accesses the part native data 64 and the assembly native data 68 of the CAD-B application 60 to retrieve a sub-set of part native data 66 and a sub-set of assembly native data 70. The sub-set of part native data 66 and the sub-set of assembly native data 70 can then be applied to the original model of the object on the CAD-A application 40 to ensure that both the CAD-A application 40 and the CAD-B application 60 are maintaining like models of the object.

In addition, other applications, can make use of the plug-ins and the associative interoperability provided by the teachings of the present invention. For example, an analysis application 74 and a manufacturing application 76 are example applications that may benefit from the associative interoperability of the present invention. Although, one of ordinary skill in the art will appreciate, that the types of applications that can take advantage of the associative interoperability provided by the teachings of the present invention are not limited to analysis and/or manufacturing applications.

Continuing with the example applications, the analysis application 74 can be provided with access to a fifth library 78, while the manufacturing application 76 can be provided with access to a sixth library 80. The analysis application 74 can gain access to the part native data 44 and the assembly native data 48, utilizing a seventh library plug-in 82. The analysis application 74 can gain access to the part native data 64 and the assembly native data 68, utilizing an eighth library plug-in 84. The manufacturing application 76 can gain access to the part native data 44 and the assembly native data 48, utilizing a ninth library plug-in 86. The manufacturing application 76 can also gain access to the part native data 64 and the assembly native data 68 utilizing a tenth library plug-in 88.

The vendors of the CAD-A application 40 provide the plug-in 82 and the plug-in 86. The vendors of the CAD-B application 60 provide the plug-in 84 and the plug-in 88. The analysis application 74 can take the sub-set of part native data 46, the sub-set of assembly native data 48, the sub-set of part native data 66, and the sub-set of assembly native data 70, and perform various analysis routines as desired. The manufacturing application 76 can take the sub-sets of native data 46, 50, 66, and 70, and manufacture work pieces based on the model object formed in the CAD-A application 40 and the CAD-B application 60.

One of ordinary skill in the art will appreciate that plug-in 52, plug-in 82, and plug-in 86 can all be instances of a same library of executable routines provided by the vendor of the CAD-A application 40. Likewise, plug-in 72, plug-in 84, and plug-in 88 can all be instances of a same library of executable routines provided by the vendor of the CAD-B application 60. Similarly, the first library 42, the third library 62, the fifth library 78, and the sixth library 80 can also be instances of a same library of executable routines.

In addition, if any of the CAD-A application 40, the CAD-B application 60, the analysis application 74, or the manufacturing application 76 should make a modification, update, or alteration to the modeled object that affects the native data, a notification can be sent out to the other applications. The other applications (for example, CAD-A application 40, CAD-B application 60, analysis application 74, and manufacturing application 76) can utilize the respective plug-ins 52, 72, 82, 84, 86, and 88 to receive modified updates to the sub-sets of native data 46, 50, 66, and 70.

The system and method of the present invention enables various applications provided by multiple vendors to become associatively interoperable. The method of the present invention, and associated libraries of executable routines, enables different applications to read each others files natively and to evaluate and create geometry or modeled objects. Vendors of commercial CAD or other applications can use the present invention to perform core-modeling functions and to inter-operate with other applications built utilizing the features of the present invention. The vendors of applications that do not author solid models, but view, analyze, and otherwise leverage content from CAD data built utilizing applications with access to libraries of the present invention, can use the present invention plug-ins to load and evaluate those models associatively. Users can integrate proprietary modeling or analysis technology into the libraries of executable routines of the present invention to provide compatibility with other authoring applications maintaining like libraries. By utilizing the libraries, of the present invention, those proprietary applications become associatively interoperable with their authoring applications. This removes the need to export files from one application to another. Further, if an original model of an object is modified, the analysis and native file interoperability combine to permit true concurrent engineering in a heterogeneous environment.

Numerous modifications and alternative embodiments of the present invention will be apparent to those skilled in the art in view of the foregoing description. Accordingly, this description is to be construed as illustrative only and is for the purpose of teaching those skilled in the art the best mode for carrying out the present invention. Details of the structure may vary substantially without departing from the spirit of the invention, and exclusive use of all modifications that come within the scope of the appended claims is reserved. It is intended that the present invention be limited only to the extent required by the appended claims and the applicable rules of law.

What is claimed is:

1. In at least one electronic device, a method of communicating between a first computer aided design (CAD) application and a second CAD application, comprising:
   storing native data and a sub-set of native data, the sub-set of native data derived by a first library of routines;
   providing a plug-in comprising a second library of routines having an application program interface (API) and being accessible by the second CAD application; and
   the plug-in conveying the sub-set of native data to second CAD application upon the second CAD application calling a second library of executable routines to request the native data and the sub-set of native data using the API, wherein the second CAD application utilizes a third library of executable routines to recreate items based on the native data and a sub-set of native data of the first CAD application.

2. The method of claim 1, wherein storing comprises placing the native data and the sub-set of native data on a recordable medium.

3. The method of claim 1, wherein the native data comprises data forming a model of an object in the first CAD application.

4. The method of claim 1, wherein the first library of executable routines is embedded within the first CAD program.

5. The method of claim 1, wherein the first library of executable routines is a component accessible by the first CAD program.

6. The method of claim 1, further comprising generating the native data as an object is modeled in the first CAD application.

7. The method of claim 1, wherein the third library of executable routines is embedded within the second CAD application.

8. The method of claim 1, wherein the third library of executable routines is a component accessible by the second CAD application.

9. The method of claim 1, further comprising the first CAD application notifying the second CAD application about updates to the sub-set of native data.

10. The method of claim 1, further comprising the first CAD application receiving a notification of a modification of the object from the second CAD application.

11. The method of claim 1, further comprising at least one of the first CAD application and the second CAD application communicating with an analysis application.

12. The method of claim 1, further comprising at least one of the first CAD application and the second CAD application communicating with a manufacturing application.

13. In at least one electronic device, a method of communicating between a first CAD application and a second CAD application, comprising:
   providing a model of an object on the first CAD application having a sub-set of native data derived by a first library of routines;
   utilizing a plug-in having a second library of executable routines in the second CAD application to retrieve the sub-set of native data from the first CAD application relating to the model of the object;
   wherein the sub-set of native data enables the second CAD application to create a second model of at least a portion of the object on the second CAD application utilizing a third library of executable routines.

14. The method of claim 13, wherein native data and the sub-set of native data are stored on a recordable medium.

15. The method of claim 13, further comprising providing native data in the form of data relating to the model of the object in the first CAD application.

16. The method of claim 13, wherein the first library of executable routines is embedded within the first CAD program.

17. The method of claim 13, wherein the first library of executable routines is a component accessible by the first CAD program.

18. The method of claim 13, wherein utilizing the plug-in further comprises calling the second library of executable routines to utilize an API to retrieve native data and the sub-set of native data.

19. The method of claim 18, wherein utilizing the plug-in further comprises filtering the native data to extract the sub-set of native data.

20. The method of claim 19, wherein utilizing the plug-in further comprises receiving the sub-set of native data from the first CAD application.

21. The method of claim 13, wherein utilizing the plug-in further comprises calling the second library of executable routines to utilize an API to retrieve the sub-set of native data.

22. The method of claim 13, wherein the third library of executable routines is embedded within the second CAD application.

23. The method of claim 13, wherein the third library of executable routines is a component of the second CAD application.

24. The method of claim 13, further comprising reading the sub-set of native data utilizing the third library of executable routines to translate the sub-set of native data and create the second model of at least a portion of the object in the second CAD application.

25. The method of claim 13, further comprising the second CAD application receiving notifications from the first CAD application about updates to the sub-set of native data.

26. The method of claim 13, wherein the sub-set of native data includes a complete history of the object in a manner enabling the second CAD application to review the history and modify the object.

27. The method of claim 13, further comprising communicating a modification of the object in the second CAD application to the first CAD application.

28. A system for modeling an object, comprising:
 a first CAD application;
 a second CAD application;
 native data and a sub-set of native data relating to an object modeled on the first CAD application stored in a first memory store, the sub-set of native data derived by a first library of executable routines;
 a plug-in having a second library of executable routines and an API accessible by the second CAD application and suitable for accessing and retrieving the sub-set of native data to enable the second CAD application to create a second model of at least a portion of the object modeled on the first CAD application using a third library of executable routines without the first CAD application having to export a file containing the object.

29. The system of claim 28, wherein the first library of executable routines is one of embedded within the first CAD application and a component accessible by the first CAD application.

30. The system of claim 28, wherein the third library of executable routines is one of embedded within the second CAD application and a component accessible by the second CAD application.

31. The system of claim 28, wherein the third library of executable routines is suitable for reading the sub-set of native data utilizing the third library of executable routines to translate the sub-set of native data and create the second model of at least a portion of the object in the second CAD application.

32. In at least one electronic device, a method of communicating between a first CAD application and a second CAD application, comprising:
 providing a first library of executable routines accessible by the first CAD application;
 generating native data as an object is modeled in the first CAD application;
 creating a sub-set of native data utilizing the first library of executable routines;
 storing the native data and the sub-set of native data;
 providing a second library of executable routines in the form of a plug-in having an application program interface (API) and being accessible by the second CAD application;
 calling the second library of executable routines to utilize the API to retrieve the native data, filter the native data to extract the sub-set of native data, and convey the sub-set of native data to the second CAD application; and
 calling a third library of executable routines to create model items based on the native data and a sub-set of native data of the first CAD application.

33. The method of claim 32, wherein the third library of executable routines is accessible by the second CAD application.

34. A computer readable medium containing software suitable for executing a method of communicating between a first computer aided design (CAD) application and a second CAD application, the method comprising:
 storing native data and a sub-set of native data, the sub-set of native data derived by a first library of routines;
 providing a plug-in having an application program interface (API) and being accessible by the second CAD application; and
 the plug-in conveying the sub-set of native data to the second CAD application upon the second CAD application calling the plug-in to request the native data and the sub-set of native data using the API, wherein the second CAD application utilizes a third library of executable routines to recreate items based on the native data and a sub-set of native data of the first CAD application.

35. A computer readable medium containing software suitable for executing a method of communicating between a first CAD application and a second CAD application, the method comprising:
 providing a model of an object on the first CAD application having a sub-set of native data derived by a first library of routines;
 utilizing a plug-in in the second CAD application to retrieve the sub-set of native data from the first CAD application relating to the model of the object;
 wherein the sub-set of native data enables the second CAD application to create a second model of at least a portion of the object on the second CAD application utilizing a third library of executable routines.

36. A computer readable medium containing software suitable for executing a method of communicating between a first CAD application and a second CAD application, the method comprising:
 providing a first library of executable routines accessible by the first CAD application;
 generating native data as an object is modeled in the first CAD application;

creating a sub-set of native data utilizing the first library of executable routines;
storing the native data and the sub-set of native data;
providing a second library of executable routines in the form of a plug-in having an application program interface (API) and being accessible by the second CAD application;
calling the second library of executable routines to utilize the API to retrieve the native data, filter the native data to extract the sub-set of native data, and convey the sub-set of native data to the second CAD application; and
calling a third library of executable routines to create model items based on the native data and a sub-set of native data of the first CAD application.

* * * * *